United States Patent
Searcy et al.

(10) Patent No.: US 9,541,637 B2
(45) Date of Patent: Jan. 10, 2017

(54) RADAR DATA COMPRESSION SYSTEM AND METHOD

(71) Applicant: DELPHI TECHNOLOGIES, INC., Troy, MI (US)

(72) Inventors: James F Searcy, Westfield, IN (US); Stephen W. Alland, Newbury Park, CA (US)

(73) Assignee: Delphi Technologies, Inc., Troy, MI (US)

( * ) Notice: Subject to any disclaimer, the term of this patent is extended or adjusted under 35 U.S.C. 154(b) by 599 days.

(21) Appl. No.: 14/445,569

(22) Filed: Jul. 29, 2014

(65) Prior Publication Data

US 2016/0033631 A1    Feb. 4, 2016

(51) Int. Cl.
| | |
|---|---|
| *G01S 13/18* | (2006.01) |
| *G01S 13/28* | (2006.01) |
| *G01S 13/34* | (2006.01) |
| *G01S 13/58* | (2006.01) |
| *G01S 13/93* | (2006.01) |
| *H03M 7/30* | (2006.01) |
| *G01S 7/28* | (2006.01) |
| *G01S 7/35* | (2006.01) |

(52) U.S. Cl.
CPC .............. *G01S 13/28* (2013.01); *G01S 7/2806* (2013.01); *G01S 7/354* (2013.01); *G01S 13/18* (2013.01); *G01S 13/343* (2013.01); *G01S 13/584* (2013.01); *G01S 13/931* (2013.01); *H03M 7/30* (2013.01); *G01S 2007/356* (2013.01); *G01S 2013/9392* (2013.01)

(58) Field of Classification Search
CPC ........ G01S 13/18; G01S 13/28; G01S 13/343; G01S 13/584; G01S 13/931; G01S 2007/356; G01S 2013/9392; G01S 7/2806; G01S 7/354
USPC .......................................................... 342/132
See application file for complete search history.

(56) References Cited

U.S. PATENT DOCUMENTS

| | | | |
|---|---|---|---|
| 5,570,691 A | 11/1996 | Wright et al. | |
| 5,708,436 A | 1/1998 | Loiz et al. | |
| 5,850,202 A | 12/1998 | Goodman et al. | |
| 7,430,254 B1 * | 9/2008 | Anderson | H04B 1/69 370/210 |

(Continued)

FOREIGN PATENT DOCUMENTS

EP    2 950 451 A1    12/2015

*Primary Examiner* — Timothy A Brainard
(74) *Attorney, Agent, or Firm* — Lawrence D. Hazelton

(57) ABSTRACT

A radar system includes a controller equipped with memory for storing data. The controller is configured to receive a time-domain signal representative of a reflected signal detected by an antenna, and transform the time-domain signal into a plurality of range datasets. Each range dataset corresponds to one of the plurality of chirps, each range dataset is represented by a series of values assigned to a plurality of range bins, and each of the values includes a sign bit. The controller is also configured to compress the plurality of range datasets by storing in the memory a portion of each of the values assigned to at least one of the plurality of range bins, wherein the portion is defined to exclude a first number of redundant sign bits of each value. The controller may further compress the portion by retaining a second number of bits of the data by excluding some of the least significant bits of each value.

4 Claims, 4 Drawing Sheets

(56) References Cited

U.S. PATENT DOCUMENTS

2009/0085800 A1 4/2009 Alland et al.
2011/0099295 A1 4/2011 Wegener
2013/0148103 A1 6/2013 Halmos et al.

* cited by examiner

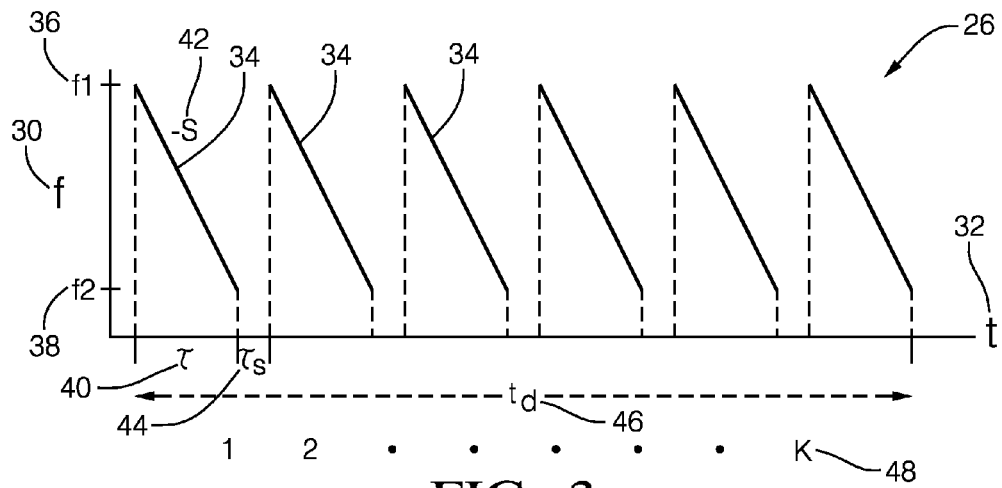
FIG. 3
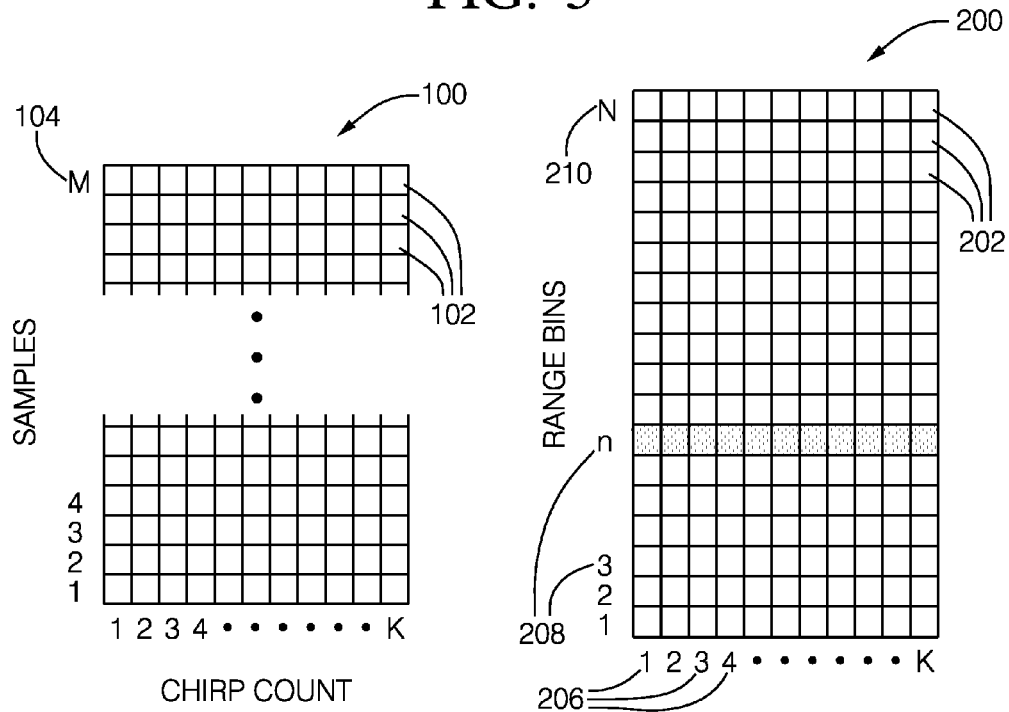
FIG. 4
FIG. 5
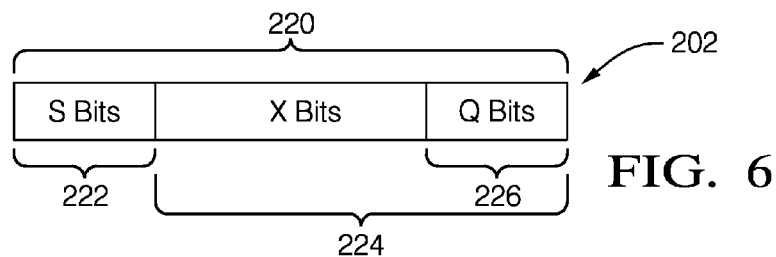
FIG. 6

RADAR DATA COMPRESSION SYSTEM AND METHOD

TECHNICAL FIELD OF INVENTION

This disclosure generally relates to radar signal processing, and more particularly relates to compressing radar data.

BACKGROUND OF INVENTION

It is known that radar systems using a Fast Chirp Waveform to emit a radar signal often accumulate large amounts of processed data in memory as arrays of data produced by a Range Fast Fourier Transform (FFT) and a Doppler FFT. The memory size depends on a variety of system parameters, but it is not uncommon for up 10,000,000 bytes (10 MB) to be temporarily stored. To minimize system cost, it is desirable to reduce the amount of memory necessary to implement a Fast Chirp Waveform.

SUMMARY OF THE INVENTION

Described herein is a system and method for radar data compression that reduces the amount of data that needs to be accumulated between the Range FFT and the Doppler FFT in a radar system using a Fast Chirp Waveform.

In accordance with one embodiment, a radar system is provided. The radar system includes an antenna and a controller. The antenna is configured to detect a reflected signal characterized as a reflection of an emitted signal reflected by an object present in a field-of-view 18 of the antenna. The emitted signal includes of a plurality of chirps. The controller is equipped with memory for storing data. The controller is configured to receive a time-domain signal representative of the reflected signal detected by the antenna. The controller is also configured to transform the time-domain signal into a plurality of range datasets. Each range dataset corresponds to one of the plurality of chirps. Each range dataset is represented by a series of values assigned to a plurality of range bins. Each of the values includes a sign bit. The controller is also configured to compress the plurality of range datasets by storing in the memory a portion of each of the values assigned to at least one of the plurality of range bins. The portion is defined to exclude a first number of redundant sign bits of each value.

In another embodiment, a method of radar data compression is provided. The method includes providing a memory for storing data; receiving a time-domain signal representative of a reflected signal detected by an antenna. The reflected signal arises from an emitted signal that includes of a plurality of chirps. The method also includes transforming the time-domain signal into a plurality of range datasets. Each range dataset corresponds to one of the plurality of chirps. Each range dataset is represented by a series of values assigned to a plurality of range bins. Each of the values includes a sign bit. The method also includes compressing the plurality of range datasets by storing in the memory a portion of each of the values assigned to at least one of the plurality of range bins, wherein the portion is defined to exclude a first number of redundant sign bits of each value.

In yet another embodiment, the plurality of range datasets is further compressed when portion is further defined to retain a second number of bits of the data by excluding least significant bits of each value.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which:

FIG. 3 is a waveform diagram of a signal emitted by the system of FIG. 1 in accordance with one embodiment;

FIG. 4 is an illustration of a data array present in the system of FIG. 1 in accordance with one embodiment;

FIG. 5 is an illustration of a data array present in the system of FIG. 1 in accordance with one embodiment;

FIG. 6 is an illustration of a data field present in the system of FIG. 1 in accordance with one embodiment.

DETAILED DESCRIPTION

Figure 1:
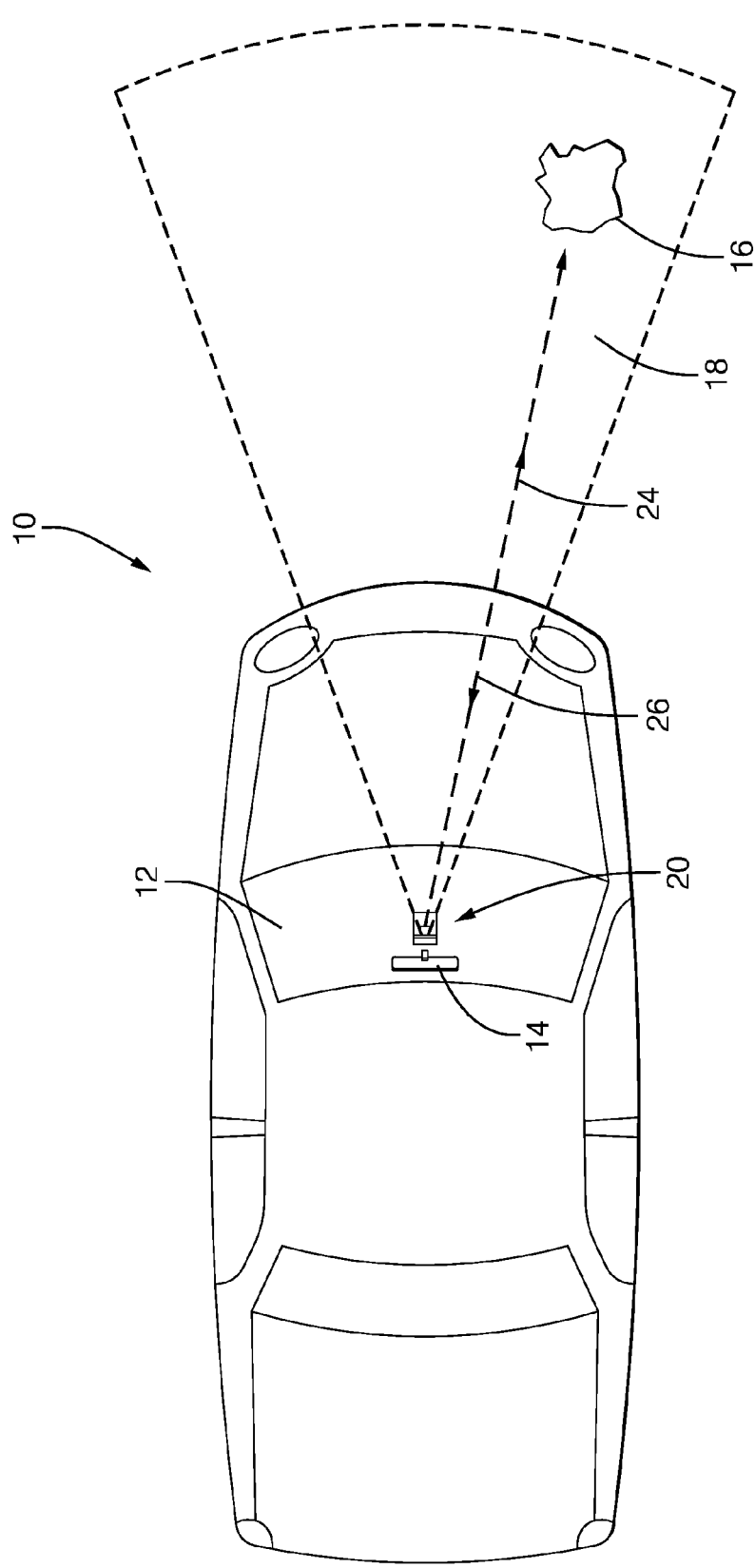
FIG. 1 is a top view of a vehicle equipped with a radar system, according to one embodiment.

FIG. 1 illustrates a non-limiting example of a vehicle 10 equipped with a radar system, hereafter the system 20. The system 20 is illustrated as being located in an interior compartment of the vehicle 10 behind a window 12 of the vehicle 10. While an automobile is illustrated, it is contemplated that the system 20 is also suitable for use on other vehicles such as heavy duty on-road vehicles like semi-tractor-trailers, and off-road vehicles such as construction equipment. In this non-limiting example, the system 20 is located behind the windshield and generally forward of a rearview mirror 14. Alternatively, the system 20 may be positioned to 'look' through a side or rear window of the vehicle 10, or be located proximate to a front or rear bumper of the vehicle 10.

The system 20 is generally configured to detect one or more objects (e.g. the object 16) relative to the vehicle 10. Additionally, the system 20 may have further capabilities to estimate the parameters of the detected object(s) including, for example, the object position and velocity vectors, target size, and classification, e.g., vehicle verses pedestrian. The system 20 may be employed onboard the vehicle 10 for automotive safety applications including adaptive cruise control (ACC), forward collision warning (FCW), and collision mitigation or avoidance via autonomous braking and lane departure warning (LDW).

Figure 2:
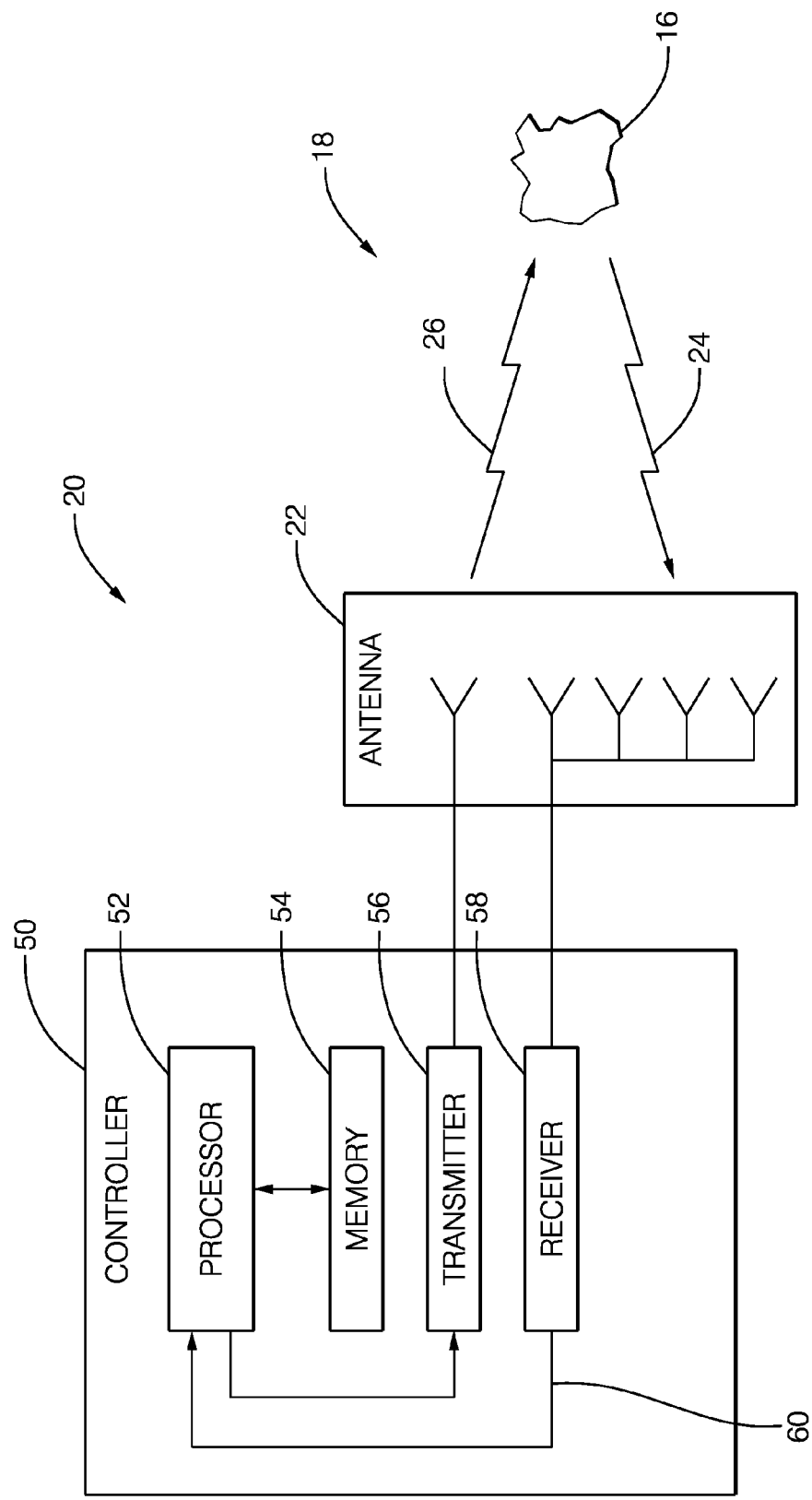
FIG. 2 is a block diagram of the system of FIG. 1, according to one embodiment.

FIG. 2 further illustrates non-limiting details of the system 20. The system 20 may include an antenna 22 configured to detect a reflected signal 24 characterized as a reflection of an emitted signal 26 reflected by an object 16 in a field-of-view 18 of the antenna 22. An example of the field-of-view 18 is generally defined by the dashed lines illustrated in FIG. 1.

FIG. 3 illustrates a non-limiting example of the emitted signal 26 as a graph of frequency 30 versus time 32. The emitted signal 26 generally includes of a plurality of chirps 34. Each of the plurality of chirps 34 is characterized as a sweep of the frequency of the emitted signal 26 from a first frequency 36 (f1) to second frequency 38 (f2) during a chirp interval 40 (τ) which defines a chirp slope 42 (−S). Each of the plurality of chirps 34 is spaced apart from a prior or subsequent chirp by a silent interval 44 ($\tau_s$). A sequence of K chirps are emitted over a time interval 46 (t*d*) to form the emitted signal 26, which is sometimes called a Fast Chirp Waveform. By way of further example and not limitation, suitable values for these variables include a first frequency 36 of 76.55 Giga-Hertz (GHz), a second frequency 38 of 76.45 GHz, a chirp interval 40 of 100 microseconds (us), a chirp slope 42 of 1 Mega-Hertz per microsecond (MHz/us), a silent interval 44 of 10 us, a chirp count 48 (K) of 64 chirps which results in a time interval 46 of 7040 microseconds (us). The silent interval 44 is selected so that to determine the total time interval between the start of one chirp and the start of a subsequent chirp.

Referring again to FIG. 2, the system 20 includes a controller 50. The controller 50 may include a processor 52 such as a microprocessor or other control circuitry such as analog and/or digital control circuitry including an application specific integrated circuit (ASIC) for processing data as should be evident to those in the art. The controller 50 may include memory 54, including volatile memory such as SDRAM, and or including non-volatile memory such as electrically erasable programmable read-only memory (EEPROM) for storing one or more routines, thresholds and captured data. The one or more routines may be executed by the processor 52 to perform steps for determining if signals received by the controller 50 indicate the presence of an object 16 in the field-of-view 18. The controller may also include a transmitter 56 and a receiver 58 for coupling the antenna 22 to the processor 52 as will be recognized by those in the art.

As described above, the controller 50 is equipped with memory 54 for storing data such as samples of signals output by the receiver 58 which corresponds to the reflected signal 24. As such, the controller 50, or more specifically the processor 52, is configured to receive a time-domain signal 60 representative of the reflected signal 24 detected by the antenna 22. The receiver 58 may include amplifiers and filters to condition the signal from the antenna 22 to be suitable for the processor 52. The processor 52 may include an analog to digital converter or ADC (not shown) configured to sample the time-domain signal 60. A suitable ADC would have a resolution of 12 bits and be operable at a sample rate of 5 million samples per second.

FIG. 4 illustrates a non-limiting example of a first array 100 of data, where each cell 102 of the first array 100 represents a memory location that contains a numerical value indicative of the time-domain signal 60 at the moment it was sampled. The time-domain signal 60 is sampled synchronously with the emitted signal 26 so that the reflected signal 24 corresponding to each chirp is sampled a sample count 104 (M) number of times. That is, each cell 102 of the first array 100 is loaded with a numerical value starting at the bottom left corner of the first array 100 and going up the first column until 'M' samples are collected, and then the next column is filled bottom to top. There may be wait time between the 'Mth' sample of one column and the first sample of a subsequent column based on the silent interval 44 (FIG. 3). By way of example and not limitation, a suitable number of samples (i.e. the value of 'M' in FIG. 4) is 1000 samples.

FIG. 5 illustrates a non-limiting example of a second array 200 of data that arises by performing a Fast Fourier Transform (FFT) on data stored in the first array 100, which is sometimes referred to as a Range FFT. Each column of data in the first array 100 represents a time-based sampling of the time-domain signal 60 for duration comparable to the chirp interval 40. The Range FFT transforms the time-based sampling into the range domain so that each cell 202 in the second array 200 contains a numerical value indicative of the magnitude of the reflected signal 24 for a particular range bin 208. As such, the controller 50 is configured to transform the time-domain signal 60 into a plurality of range datasets 206, wherein each of the range datasets 206 (i.e. each column of the second array 200) corresponds to one of the plurality of chirps 34. That is, each vertical column of the second array 200 is a range dataset 206 that provides an indication of the magnitude of the reflected signal 24 corresponding to a particular range from the antenna 22.

Each range dataset (i.e. each column) is represented by a series of values, typically complex values, assigned to a plurality of range bins. For example, the second range bin (row 2) may suitably correspond to a distance or range from the antenna 22 of 1.5 meters (m)+/−0.75 m, and there may be 100 range bins so the range bin count 210 (i.e. the Nth range bin) may suitably correspond to a distance or range from the antenna 22 of 150 m+/−0.75 m. There may be data available for distances or ranges greater than the Nth range bin, but that data is discarded and not stored in the second array 200.

FIG. 6 illustrates a non-limiting example of a format of a data field 220 stored in a cell 202 of the second array 200. By way of example and not limitation, the data field may be 32 bits (e.g. a 16-bit complex value) The numerical values in each cell 202 are stored in 2's-compliment form and are right-justified within the data field 220 of each cell 202. As such, each of the values includes one or more sign bits 222 (S-bits). Small magnitude positive values will have multiple repeated zeroes (0's) to the left of a value portion 224 of the data field 220, and small magnitude negative values will have multiple repeated ones (1's) to the left of the value portion 224 of the data field 220. These multiple repeated 0's or 1's are generally redundant and the duplicates can be discarded without changing the value being stored. By discarding a first number of the redundant bits of the sign bits 222, the data can be compressed so that the amount of memory necessary to store the second array 200 can be reduced.

It is recognized that the first number of the sign bits 222 discarded would need to be tracked, and that if the first number of sign bits 222 was tracked for each cell 202 on an individual basis, there would likely not be a significant amount or degree of compression realized. However, if the second array 200 were segregated in to sections or portions, and the first number of sign bits discarded were held constant across the entirety of a particular portion of the second array 200, then a substantial degree of compression could be realized.

How the second array 200 could be segregated into portions for the purpose of discarding a fixed number of the sign bits 222 could be determined by searching for portion boundaries where all the data within a portion boundary has a magnitude less than or greater than some threshold. Alternatively, since it is expected that the general magnitude of the values stored would be similar across a particular range bin (i.e. relatively constant across a particular horizontal row of the second array 200), the first number of the sign bits 222 discarded could be held constant across a range bin 208. Then only one number of the sign bits 222 discarded for each particular range bin (each row) would need to be stored. In other words, the first number of redundant sign bits excluded could be varied or selected according to the maximum magnitude of the values assigned to a particular range bin across all of range datasets. That is, the first number of redundant sign bits excluded from a particular horizontal row of the second array 200 would be determined based on the maximum magnitude of the data occurring in that particular row. By this technique, the controller 50 is configured to compress the plurality of range datasets 206 by storing in the memory 54 a portion (e.g. the value portion 224 and at least one of the sign bits 222) of each of the values assigned to at least one of the plurality of range bins 208, wherein the portion is defined to exclude a first number of redundant sign bits of each value.

Since the resolution of data from relatively large magnitude signals may be more than is necessary for the system 20 to reliably detect the object 16 (or multiple objects), it may be advantageous if the plurality of range datasets 206 is further compressed if the portion of the data field 220 is further defined to retain a second number of bits of the data by excluding some of the least significant bits 226 (Q-bits) of each value. The second number of data bits retained, with exclusion of redundant sign bits and remaining LSBs, will then determine the performance achievable in subsequent processing of the compressed data. If there are some range bins where greater than typical accuracy is desired, then some range bins may store more bits than others. However, for simplicity of memory management, it may be preferable to always store the same number of bits in each cell 202 for the entirety of the second array 200, for example eight bits.

The data being compressed is from the output of the Range FFTs. After all of the Range FFTs have been processed, the data from one range bin for each of the Range FFTs will be arranged into a single vector. A Doppler FFT will then be performed across that vector. This will determine the Doppler value of an object within that particular range bin. The number of bits stored determines the level of accuracy that can be achieved in subsequent processing of a Doppler FFT. As such, the number of bits stored or retained is preferably determine a priori as part of the design of the compression strategy, keeping in mind that increasing the bits retained provides for increased dynamic range in a subsequent Doppler FFT, but degrades the compression ratio.

If there is more than one object within that range bin, then multiple objects can be detected. One important consideration is the ability to detect a small object in the range bin given the presence of a larger object in that same range bin. The Doppler FFT process has some requirements as to the dynamic range of the measurement. It is desirable to identify multiple signals of varying amplitudes within this Doppler FFT. Supposing that the signals from two objects differ in amplitude by, for example, 30 dB. To distinguish these to objects, the dynamic range of the output needs to be maintained to better than 30 dB. If the dynamic range is less than 30 dB in the FFT, it may not be possible to distinguish the smaller signal in the Doppler FFT output from the noise generated by the larger signal. As such, the dynamic range of the Doppler FFT will be generally limited by the number of bits of the input data retained. This is because the data is quantized at X bits below the peak signal. This quantization noise can mask smaller objects. Therefore, the number of bits stored in this compression sets the dynamic range that can be achieved within the Doppler FFT.

There are general limits as to how much dynamic range is important in the Doppler FFT. Based on various design decisions (such as the side-lobe level of the FFT response from the larger object), signals more than some level below the largest signal in the range bin may be of no concern. If, for example, this level is 40 dB, then keeping a number of bits that result in more dynamic range in the Doppler FFT than is useful is unnecessary. If, for example, retaining 7 bits in the compression routine is sufficient to provide 40 dB dynamic range in the resulting Doppler FFT, then saving more than 7 would be unnecessary, and would degrade the compression ratio. Accordingly, a certain minimum number of bits are retained to protect the dynamic range that can be achieved in the resulting Doppler FFT, so that no more bits than are necessary are retained to achieve a high compression ratio.

A third array (not shown) may be produced that is a one-dimensional array, i.e. a single column or row of data, by performing a subsequent Fast Fourier Transform (FFT) on data stored in the second array 200, which is sometimes referred to as a Doppler FFT. Each horizontal row of data in the second array 200 (e.g. row 'n') represents a sample of the reflected signal 24 for a particular range. A Doppler FFT transforms the range domain into the Doppler domain so variation in the magnitude of the range domain over time can be evaluated to detect relative motion of the object 16 relative to the antenna 22. The teachings about data compression described above can also be used to compress data produced by the Doppler FFT.

Figure 7:
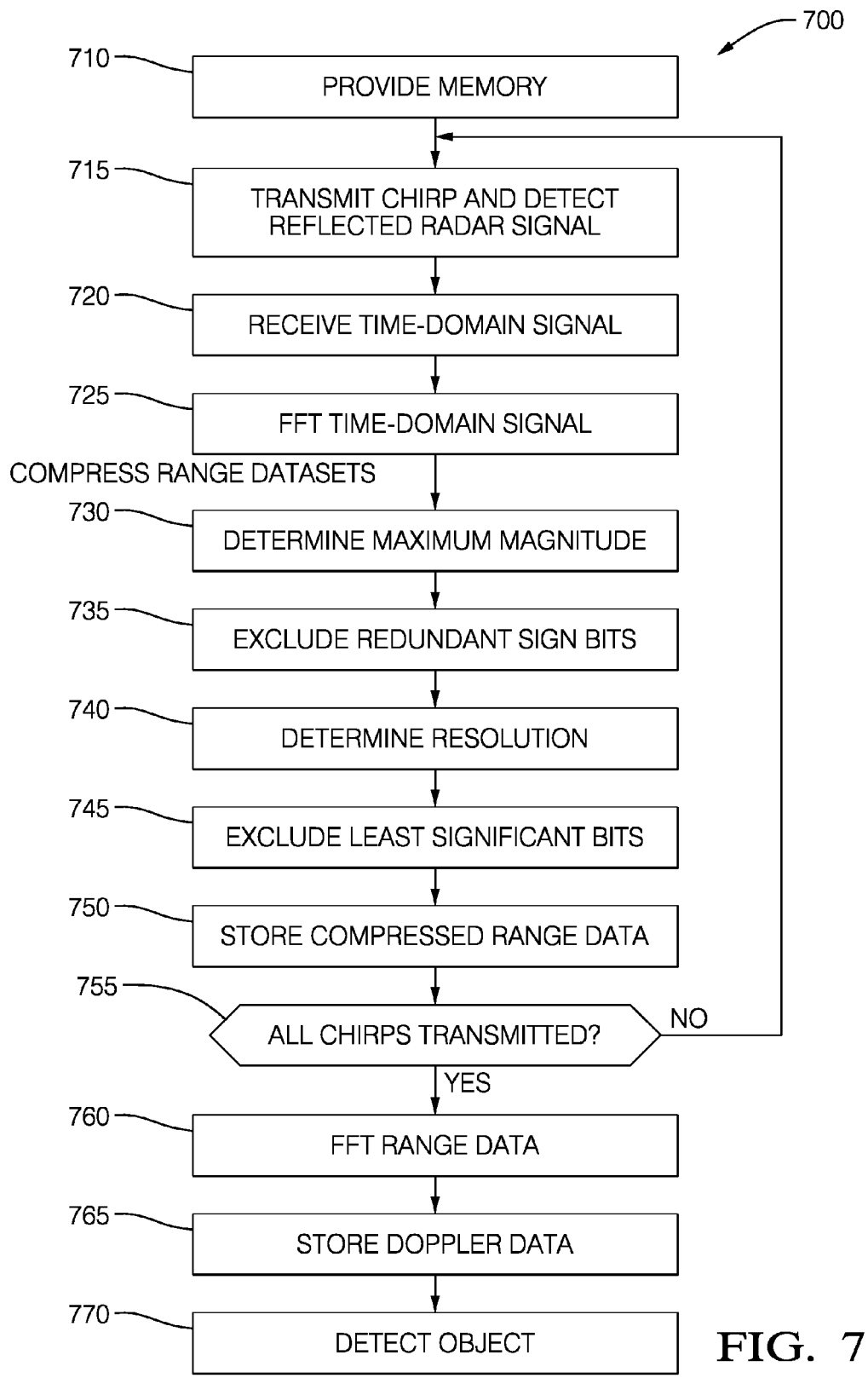
FIG. 7 is a flowchart of a method performed by the system of FIG. 1 in accordance with one embodiment.

FIG. 7 illustrates a non-limiting example of a method 700 of radar data compression. Compressing radar data is advantageous as it reduces the amount of memory that a radar system (e.g. the system 20) must be equipped with to handle processing of radar signals (e.g. the time-domain signal 60)

Step 710, PROVIDE MEMORY, may include providing or equipping the controller 50 with a memory 54 such as random access memory (RAM) for storing data captured or generated by the processor 52.

Step 715, TRANSMIT CHIRP AND DETECT REFLECTED SIGNAL, may include operating the transmitter 56 to transmit the emitted signal 26 that includes a plurality of chirps 34, and operating the receiver 58 to receive a signal corresponding to the reflected signal 24 detected by an antenna 22. Those in the art will recognize that the reflected signal 24 arises from the emitted signal 26 that includes of the plurality of chirps 34. Step 715 may also include operating the receiver 58 in order to generate the time domain signal which corresponds to, or is representative of, the reflected signal 24.

Step 720, RECEIVE TIME-DOMAIN SIGNAL, may include the processor 52 capturing or receiving the time-domain signal 60 which, as noted before, is representative of a reflected signal 24. Step 720 may include operating an analog-to-digital converter or ADC (not shown) within the processor in order to capture digitized samples of the time-domain signal 60. These digitized samples may be stored in the memory 54, and may be organized in the memory 54 so as to be accessible in either a row-wise or column-wise manner similar to that suggested by the first array 100.

Step 725, FFT TIME-DOMAIN SIGNAL, may include transforming the digitized samples that correspond to the time-domain signal 60 stored in the first array 100 into a plurality of range datasets 206 which may be stored in the memory 54 and organized in a manner similar to that suggested by the second array 200. Each of the range datasets 206 corresponds to one of the plurality of chirps 34 as each range dataset is represented by a series of values assigned to a plurality of range bins where the values correspond to the strength or magnitude of the reflected signal for a particular distance from the antenna 22. The values stored in the cells 202 of the second array 200 are preferable stored as a 2's-complement binary value, so each of the values includes at least one sign bit, and as it the convention for a 2's-complement binary value, may include one or more redundant sign bits if the magnitude of the value stored requires less than the maximum number of bits available in each of the cells 202.

Steps 730-745 are associated with the unnumbered step COMPRESS RANGE DATASETS. In general, compressing the plurality of range datasets arising from the FFT of the time-domain signal 60 is accomplished by storing in the memory 54 a portion of each of the values assigned to each of the plurality of range bins. In general, the portion is defined to exclude redundant sign bits from the sign bits 222, and optionally exclude some of the least significant bits 226.

Step 730, DETERMINE MAXIMUM MAGNITUDE, may include searching all of the values stored in the range bin 208 for the maximum positive or negative magnitude value so that the first number of redundant sign bits excluded is the same for all of the values stored in a particular range bin. That is, it may be preferable to exclude the same number of redundant bits across a particular range bin even if that means that some of the values in the particular range bin still have some redundant sign bits. Otherwise, if the first number of redundant sign bits excluded varied across the range bin, then that variation would need to be accounted for so the compression factor would likely be reduced.

Step 735, EXCLUDE REDUNDANT SIGN BITS, may include storing only the portion of the data field 220 necessary to retain the value portion 224 and at least one of the sign bits 222. It may be advantageous if the first number of redundant sign bits excluded is varied or selected in accordance with a maximum magnitude of the values assigned to a particular range bin across the plurality of range datasets. That is, the first number of sign bits excluded for a particular range bin may be constant, but the first number of sign bits excluded for some other range bin may be different depending on the maximum magnitude detected in that other range bin.

Step 740, DETERMINE RESOLUTION, may include recalling from memory a predetermined resolution value, or dynamically determining a desired resolution based on the content of the time-domain signal 60. For example, if prior passes through the object detection process suggested that the object 16 was not a single target but include multiple targets, or that the location of object 16 was not determined with a high degree of confidence, then the resolution may be temporarily increased to better assess the object 16. However, in order to keep the management of the memory 54 simple, it may be preferable if the resolution was always held constant so the size of the portion is defined such that a predetermined number of bits are stored in each range bin.

Step 745, EXCLUDE LEAST SIGNIFICANT BITS, may include excluding some of the least significant bits 226 so that a second number of bits retained and stored is a constant. If the value portion 224 has a relatively large number of bits, then some of the least significant bits 226 may be excluded without sacrificing accuracy. That is, the plurality of range datasets 206 may be further compressed when the portion is further defined to exclude some of least significant bits 226 of each value.

Step 750, STORE COMPRESSED RANGE DATA, may include the processor 52 storing into the memory 54 the contents of the second array 200 for future use. For example, the transmitting of the plurality of chirps 34 in the emitted signal 26 and the detecting/receiving of the reflected signal 24 may be repeated multiple times in order to increase the overall signal to noise ratio for more confidently determining the location and/or relative motion of the object 16.

Step 755, ALL CHIRPS TRANSMITTED?, may include comparing the number of chirps transmitted to the value of the chirp count 48. If not all of the plurality of chirps 34 have been transmitted, the method 700 returns to step 715. If all of the chirps have been transmitted, the method 700 proceeds to step 760. It is recognized that some of the steps performed within the processing loop defined by steps 715 to 750 may be done outside of a loop that transmits the emitted signal 26 and detects the reflected signal 24 if the speed if the processor 52 is lacking. However, performing the steps within the defined loop as presented is preferred as it generally provides increased memory efficiency.

Step 760, FFT RANGE DATA, may include applying a FFT to each of range bin 208 in order to determine an indication of relative motion between the antenna 22 and the object 16

Step 765, STORE DOPPLER DATA, may include compressing the data from step 760 using similar techniques for excluding redundant sign bits and limiting the resolution as describe above with regard to the second array 200.

Step 770, DETECT OBJECT, may include searching the stored data for patterns that indicate various characteristics of the object 16 or other potential objects in the field-of-view 18 such as size, location, and motion relative to the vehicle 10.

Accordingly, a radar system (the system 20), a controller 50 for the system 20 and a method 700 of radar data compression is provided. There are multiple ways that the data processing describe herein can be performed. For example, the controller 50 may collect all time-domain samples, and then perform a 2-D FFT. Alternatively, the controller 50 may process the Range FFT as the data is acquired, and then perform the Doppler FFT after the full look is acquired. Regardless of the exact order of steps, it is necessary to collect the samples from all of the chirps into a relatively large memory buffer before the Doppler FFT can be performed. This is because the Doppler FFT requires data from all chirps before significant processing can be performed.

The size of the memory 54 is determined by various design factors, but it generally holds that an increased memory size is required for a higher resolution (e.g. higher performance) measurement for a given set of range, Doppler coverage parameters. Because memory (e.g. RAM) is a relatively expensive component of a radar system, it is advantageous to reduce the amount of RAM required for a given design. Other types of compression such as lossless compression algorithms used on data similar to that found in a radar system typically do not achieve high compression ratios.

Described herein is a compression technique is to save the minimum number of bits per value to ensure data is retained to an adequate dynamic range. The dynamic range of the data (or smallest amplitude signals of interest relative to the largest in the signal) will determine the second number of bits required to be retained. The data that is collected has various factors that drive dynamic range. The difference in the Radar Cross Section (RCS) of objects that needs to be measured. The RCS is an object parameter which indicates the signal that will be reflected from an object back toward the radar. Typically, automotive radars have an interest in objects from perhaps 40 dB square meters (dBsm) to −20 dBsm. The signal amplitude received from an object varies with $1/\text{range}^4$, which means that objects with the same amplitude will have large signal level differences with range. This means that an object's signal level will vary with $40*\log(\text{range}_{ref}/\text{range})$.

The signal amplitude received at the antenna of the radar is typically filtered to manage the signal amplitude received at the ADC. This baseband filter response is typically used to counteract the 1/range$^4$ signal dependence, along with rejecting various leakage and bias components of the radar system. Other minor factors can exist, but these are the primary drivers for a single receive channel. As the Range FFT and Doppler FFT are performed, they will achieve a Signal to Noise (SNR) gain, which has the effect of increasing the desired dynamic range of the output signal compared with the input signal. The incoming data will preferably be processed through the end of the Range FFT without compression. This is done as the data is being received, one chirp at a time, without being stored in a buffer to receive all incoming ADC data. The data to be stored will be the X most significant bits of data after some redundant sign bits are removed. For clarification, values are typically represented as right-justified within a data field. Small positive values will have multiple zeroes to the left of the value. Small negative values (stored in 2's complement) will have 1's to the left of these values. These bits are referred to as redundant and can be discarded without changing the value being stored.

For compression, X bits per location, where X is constant across the entire memory buffer. Selection of X is based upon the dynamic range needing to be achieved through the second stage FFT. The first number of sign bits discarded will be constant over some range of the memory buffer, to prevent the need to store this first number individually for each location. The first number of sign bits needs to be stored in some manner so that the data can be restored when being decompressed. Because the data that is to be stored from one chirp must be compressed before the signals from all chirps are known, only the data available prior to and including that chirp can be used for determining sign bits. This compression approach will determine the first number of sign bits to be discarded ("S") independently for each Range bin.

After the Range FFT, signals from objects at different ranges have already been separated into different bins. By limiting consideration of S to a single range bin, two factors which drive dynamic range requirements are eliminated, namely the 1/R$^4$ dependence of the signal on range and the frequency response of the baseband signal chain. Once all of the chirps have been collected, the largest signal within a range bin will determine the minimum value of S that can be used within the range bin. Although the signal amplitude may be relatively constant within a range bin across chirps, values later in the sequence may have fewer redundant sign bits than assumed previously in the sequence.

This approach will use a value of S equal to the minimum of the largest value possible in the current chirp and the minimum value used in all previous chirps. In this manner, the value of S can change across the chirps, but only downward as the chirps are transmitted. Later chirps will not have a larger value of S than earlier ones within a range bin. This approach is a strategy to reduce the information needed to record which bits are stored within the range bin. Recorded data only needs to include initial S value and chirps in which the S value changes While this invention has been described in terms of the preferred embodiments thereof, it is not intended to be so limited, but rather only to the extent set forth in the claims that follow.

We claim:

1. A radar system comprising:
    an antenna configured to detect a reflected signal characterized as a reflection of an emitted signal reflected by an object present in a field-of-view of the antenna, wherein the emitted signal includes of a plurality of chirps; and
    a controller equipped with memory for storing data, said controller configured to
    receive a time-domain signal representative of the reflected signal detected by the antenna,
    transform the time-domain signal into a plurality of range datasets, wherein each range dataset corresponds to one of the plurality of chirps, each range dataset is represented by a series of values assigned to a plurality of range bins, and each of the values includes a sign bit, and
    compress the plurality of range datasets by storing in the memory a portion of each of the values assigned to at least one of the plurality of range bins, wherein the portion is defined to exclude a first number of redundant sign bits of each value.

2. The system in accordance with claim 1, wherein the first number of redundant sign bits excluded is varied in accordance with a maximum magnitude of the values assigned to a particular range bin across the plurality of range datasets.

3. The system in accordance with claim 1, wherein the plurality of range datasets is further compressed when the portion is further defined to retain a second number of bits of the data by excluding least significant bits of each value.

4. The system in accordance with claim 1, wherein the portion is defined such that a predetermined number of bits are stored in each range bin.

* * * * *